US005602770A

United States Patent [19]
Ohira

[11] Patent Number: 5,602,770
[45] Date of Patent: Feb. 11, 1997

[54] ASSOCIATIVE MEMORY DEVICE

[75] Inventor: Tsuyoshi Ohira, Chiba, Japan

[73] Assignee: Kawasaki Steel Corporation, Hyogo, Japan

[21] Appl. No.: 594,673

[22] Filed: Feb. 2, 1996

[30] Foreign Application Priority Data

Feb. 3, 1995 [JP] Japan .................................. 7-016969

[51] Int. Cl.$^6$ .............................. G11C 15/00; G11C 7/00; G11C 8/00
[52] U.S. Cl. .......................... 365/49; 365/203; 365/205; 365/230.06
[58] Field of Search ............................. 365/49, 203, 205, 365/230.06

[56] References Cited

U.S. PATENT DOCUMENTS 4,144,589   3/1979   Baker et al. ............................. 365/203

Primary Examiner—David C. Nelms
Assistant Examiner—Trong Phan
Attorney, Agent, or Firm—Oliff & Berridge

[57] ABSTRACT

An associative memory device of the present invention capable of operation at high speed and a reduced power consumption comprises: a memory array; precharge circuits each provided for each pair of a data line and an inverted data line in the memory array to precharge the data lines and the inverted data lines to a precharge potential in a standby mode before at least a data retrieval operation; and data line drivers each provided for the each pair of the data line and the inverted data line to drive the data lines and the inverted data lines to one of a HIGH logic level and a LOW logic level at least in the data retrieval mode, wherein the precharge potential of the data lines and the inverted data lines is lower than a supply potential and higher than a ground potential, preferably, a middle potential between the supply potential and the ground potential.

14 Claims, 10 Drawing Sheets

ASSOCIATIVE MEMORY DEVICE

BACKGROUND OF THE INVENTION

The present invention relates to an associative memory device and, more specifically, to an associative memory device in which the precharge potential of the data lines and the inverted data lines is set to a potential between a supply potential and a ground potential.

An associative memory device is called also a content addressable memory, and comprises a plurality of associative memory cells. Each associative memory cell comprises a data storage unit to store data like an ordinary semiconductor memory does, and a data retrieval unit to retrieve data from the data storage unit. Data to be retrieved having a predetermined number of bits are stored in the data storage units of the associative memory cells. Then, the data stored in the data storage units (hereinafter referred to as "stored data") are match-retrieved with the data for match-retrieving (hereinafter referred to as "retrieval data") by the data retrieval units, that is, whether or not there are stored data matching the retrieval data and match addresses in which the matched data are stored are retrieved and outputted in a single cycle. The associative memory device capable of instantly retrieving desired data from among enormous data is used for improving the performance of a system that executes a data retrieval process frequently.

FIG. 11 shows the circuit configuration of one of the prior art associative memory cells of such an associative memory device by way of example. The associative memory cell 150 comprises a data storage unit 152 and a data retrieval unit 154.

The data storage unit 152 is an ordinary SRAM cell capable of storing 1-bit data, comprising inverters 154a and 154b, and transfer gates 156a and 156b. The respective inputs and the outputs of the inverters 154a and 154b are cross-coupled to form a latch circuit capable storing 1-bit data. One of the inputs and one of the outputs (the sources or the drains) of the transfer gates 156a and 156b are connected to the inputs of the inverters 154a and 154b (or the outputs of the inverters 154b and 154a) and the other input and the other output of the transfer gates 156a and 156b are connected to a data line DL and to an inverted data line $\overline{DL}$, respectively, and the gates of the transfer gates 156a and 156b are connected to a common word line WL. Various kinds memory cells such as DRAM cell and ROM cell may be employed for the data storage unit instead of the SRAM cell.

The data retrieval unit 154 is an exclusive OR circuit that compares each bit of the stored data with each bit of the retrieval data. The data retrieval unit 154 comprises N-type MOS transistors (hereinafter referred to as "NMOSs") 158a, 158b, 160a and 160b. The sources of NMOSs 158a and 158b are connected to the drains of the NMOSs 160a and 160b in series respectively. The respective drains of the NMOSs 158a and 158b are connected to a common match line $\overline{ML}$, the sources of the NMOSs 160a and 160b are connected to a common discharge line SL. The respective gates of the NMOSs 158a and 158b are connected to the respective outputs of the inverters 154a and 154b of the data storage unit, respectively, and the respective gates of the NMOSs 160a and 160b are connected to the data line DL and the inverted data line $\overline{DL}$, respectively. The data retrieval unit 154 shown in FIG. 11 is an example only, and various types of such circuits are proposed currently.

The match line $\overline{ML}$ described above is a signal line on which the result of match retrieval between the stored data and the retrieval data outputted. A P-type MOS transistor (hereinafter referred to as "PMOS") 162 and an inverter 164 are connected to the match line $\overline{ML}$. The drain of the PMOS 162 is connected to the match line $\overline{ML}$, the source of the PMOS 162 is connected to a power supply, and the gate of the PMOS 162 is connected to a control line $\overline{\Phi}_{PM}$. The input and the output of the inverter 164 are connected to the match line $\overline{ML}$ and an encoder (not shown), respectively. The discharge line SL is a signal line through which the charge of the precharged match line $\overline{ML}$ is discharged when the stored data does not match the retrieval data. The discharged line SL is connected to a drain of NMOS 166 and a source and a gate of NMOS 166 are connected to a ground and the control line $\overline{\Phi}_{PM}$, respectively. A predetermined number of the associative memory cells, for example, thirty-two cells, are arranged in a row to form a word memory. Each cell in a word memory stores and compares each bit of data. All the cells in the word memory share a word line WL, the match line $\overline{ML}$, and the discharge line SL. A predetermined number of the word memories are arranged in a column to form a memory array. That is, the associative memory cells are arranged in rows and columns. Each cell in the memory array is specified with the position of the row (row address) and the position of the column (column address). All the cells in a column share a pair of a data line and an inverted data line.

When SRAM cells are used as the storage units of the associative memory cells, both the pair of the data line and the inverted data line are connected to all of the memory cells arranged in the corresponding column.

A standby mode, a read mode for a data read operation, a write mode for a write operation and a retrieval mode for a data retrieval operation of the associative memory device comprising such associative memory cells will be described below.

In the standby mode, none of the data read operation, the data write operation and the data retrieval operation are carried out, and the word line WL and the control line $\overline{\Phi}_{pm}$ are in LOW logical level. In this state, the pair of the data line DL and the inverted data line $\overline{DL}$ are precharged at a supply potential, i.e., a potential of the power supply, by a precharging circuit (not shown) to enhance operating speed, and the match line $\overline{ML}$ is precharged at a supply potential through the PMOS 162 to enhance retrieving speed.

In the read mode, the address of a word memory from which data are to be read is inputted to request the data read operation. When the data read operation is started, the precharging of the data line DL and the inverted data line $\overline{DL}$ at the supply potential is ended, the address is decoded and the word line WL of a selected word memory is raised to HIGH logic level. In the word memory connected to the raised word line WL, the transfer gates 156a and 156b turn ON, and then the data and its inverted data stored in the word memory are outputted through the transfer gates 156a and 156b on the data line DL and the inverted data line $\overline{DL}$, respectively. A differential voltage signal corresponding to each bit of the data stored in the word memory is applied to the data line DL and the inverted data line $\overline{DL}$ precharged at the supply potential, and the differential voltage signal is amplified by a sense amplifier, not shown, to read the data from the selected word memory.

In the write mode, the address of a word memory to which data are to be written is inputted to request the data write operation.

When the data write operation is started, the precharging of the data line DL and the inverted data line $\overline{DL}$ at the supply potential is ended, each bit of the data and each bit of its inverted data are driven on the data line DL and the inverted data line $\overline{DL}$ by a data line driver, not shown, the address is decoded and the word line WL of a selected word memory is raised to HIGH. In the word memory connected to the raised word line WL, the transfer gates 156a and 156b turn ON, and then the data and its inverted data driven on the data line DL and the inverted data line $\overline{DL}$ are transferred through the transfer gates 156a and 156b to the inputs of the inverters 154a and 154b and are latched to write the data to the selected word memory.

In the retrieval mode for retrieving the stored data and the retrieval data is started when the data retrieval operation is requested after entering the retrieval data. When the data retrieval operation is started, the precharging of the data line DL and the inverted data line $\overline{DL}$ at the supply voltage potential is ended, each bit of retrieval data and each bit of its inverted data are driven on the data line DL and the inverted data line $\overline{DL}$ by the data line driver, not shown, the control line $\Phi_{PM}$ goes HIGH, the precharging of the match line $\overline{ML}$ is ended and the NMOS 166 turns ON, so that each cell in the word memory starts to compare each bit of the stored data and corresponding bit of the retrieval data. The retrieval operation starts simultaneously in all the cells in all the word memories for matching between the stored data and the retrieval data.

For example, when a logic HIGH is held as stored data, i.e., when the respective potentials of the outputs of the inverters 154b and 154a are HIGH and LOW, respectively, a HIGH is given as the retrieval data, i.e., when the respective potentials of the data line DL and the inverted data line $\overline{DL}$ are HIGH and LOW, respectively, the NMOSs 158b and 160a are ON and the NMOSs 158a and 160b are OFF. Therefore, both the series circuit of the NMOSs 158a and 160a and the series circuit of the NMOSs 158b and 160b are nonconductive, the match line $\overline{ML}$ remains in a precharged potential, i.e., HIGH logic level. Accordingly, if the stored data matches the retrieval data, the potential of the match line $\overline{ML}$ remains HIGH.

When a LOW is given as the retrieval, i.e., when the respective potentials of the data line DL and the inverted data line $\overline{DL}$ are LOW and HIGH, respectively, the series circuit of the NMOSs 158a and 160a is OFF, and the series circuit of the NMOSs 158b and 160b is ON. Consequently, the charge on the precharged match line $\overline{ML}$ is discharged through the NMOSs 158b and 160b, the discharge line SL and the NMOS 166 to the ground, and the match line $\overline{ML}$ goes LOW. Accordingly, when anyone bit of the stored data and the corresponding bit of the retrieval data are not the same, the match line $\overline{ML}$ is discharged and goes LOW.

Thus, only when every bits of the stored data stored in the associative memory cells connected to the same match line $\overline{ML}$, for example, the associative memory cells forming a word memory and every corresponding bits of the retrieval data are the same, the match line $\overline{ML}$ is kept HIGH. And the outputs are given to an encoder, not shown, the addresses are encoded and the encoded addresses are outputted sequentially in predetermined order of priority.

This conventional associative memory device is in the standby mode before any one of the read mode, the write mode and the retrieval mode. In the standby mode, the data line DL and the inverted data line $\overline{DL}$ are precharged at the supply potential. Therefore, the potentials of the data line DL and the inverted data line $\overline{DL}$, in general, swing between the supply potential and the ground potential during the read mode, the write mode and the retrieval mode. During these large swing of the potential, a high current flows and a large current (power) is consumed.

The data retrieval operation is not dependent on the type of the memory cells, although the detail of the data read and write operation varies with type of the used memory cells.

It was proposed to divide a memory device in two or more blocks each includes a memory array to reduce power consumption due to the swings of the potentials of the data lines and the inverted data lines. Only one of the blocks of the memory device including the selected word memory proceeds the data read or data write operation, and the other blocks are kept in the standby mode. The power consumption of a memory device, such as a SRAM or a ROM, for the data read operation and the data write operation is effectively reduced by this technique.

Since data only stored in DRAM cells are destructed when the data are read from selected cells, the read data are amplified to the full logic level (for example, the ground potential and the supply potential) by sense amplifiers and the amplified data are rewritten to the cells through the data lines connected to the selected cells. At the same time, data in all the DRAM cells which share a word line with the selected cells are also amplified and rewritten in the cells through the data lines. Similar rewriting are also made to the DRAM cells which share a word line with the selected cells during the data write operation.

However, since the DRAM stores data only temporarily in storage capacitors, the stored data is destructed in a certain time period by leakage currents at the junctions or the field isolator. Therefore, the data must be rewritten periodically to the memory cells. Such a periodical rewriting operation is called refreshing. Generally, refreshing is carried out 256 cycles per 4 ms for a 256-Kb DRAM and 512 cycles per 8.2 ms for 1-Mb DRAM; that is, all the memory cells of a 256-Kb DRAM are refreshed by 256 refreshing cycles, 4 ms.

The number of data lines and the inverted data lines which swing to the full logic level during the data read operation or the data write operation is usually determined to properly make the refresh operation. Therefore, the power consumption due to the swing of the potentials of the data lines and the inverted data lines is not effectively reduced in DRAMS by dividing into the blocks. To overcome this DRAMs by dividing into the blocks. To overcome this problem, a technique of precharging the data lines and the inverted data lines at a potential equal to half the supply potential was proposed.

However, though this technique is effective to reduce power consumption of DRAMS which need rewriting and refreshing operations, it is not employed in SRAMs and ROMs which do not need rewriting or refreshing operation.

Note that, in a DRAM with the open data line architecture, each memory array is divided in two sub arrays and the precharging circuits, the data line drivers and the sense amplifiers are arranged between the two sub arrays. Each of the each pair of the data line and the inverted data line is connected to the memory cells arranged in the corresponding column in respective sub array and to the respective dummy cell arranged adjacent to the same sub array. While, in a DRAM with the folded data line architecture, each of the each pair of the data line and the inverted data line is connected to a half of the memory cells arranged in the corresponding column in the memory array and to the respective dummy cell arranged adjacent to the memory array. That is, only one of the pair of the data line and the inverted line is connected to each of the memory cells in the corresponding column, in both cases. Each of the pair of the data line and the inverted data line is used as the data line for the memory cells to which it is connected and as the inverted data line for the cells to which the other one of the pair is connected.

However, the potentials of the data line and the inverted line in a DRAM swing to the full logic level during the data write and the data read operations as in the case in a SRAM. During the data read operation, for example, a differential voltage signal made by the difference of the charges stored in a selected cell connected to a data line and that in the dummy cell connected to the corresponding inverted data line is amplified by a sense amplifier to the full logic level.

When DRAM cells are used as the storage units of the associative memory cells, similar data line structure can be used in the associative memory device.

In the associative memory device, a word memory storing the stored data matching the retrieval data cannot generally be presupposed when carrying out the data retrieval operation. Therefore, all the data lines DL and all the inverted data lines $\overline{DL}$ corresponding to the retrieval data must be driven. If the potentials of all the data lines DL and all the inverted data lines $\overline{DL}$ swing between the ground potential and the supply potential, which is carried out by the conventional associative memory device, a high current flows and a large power is consumpted in the associative memory device. Furthermore, in the conventional associative memory device, the NMOSs 160a and 160b of the retrieval unit 154, in addition to the transfer gates 156a and 156b of the storage unit 152, are connected to the data line DL and the inverted data line $\overline{DL}$ as shown in FIG. 11 and the electrostatic capacitiances of the data line DL and the inverted data line $\overline{DL}$ of the associative memory device is greater than those of the ordinary semiconductor memory such as a SRAM and a DRAM. Therefore, the power consumption of the conventional associative memory device is very large. Such a problem in power consumption becomes more conspicuous and serious in associative memory devises as the storage capacity increases, for example, from 64 Kb to 256 Kb.

SUMMARY OF THE INVENTION

Accordingly, in view of the foregoing problems in the prior art, it is an object of the present invention to provide an associative memory device capable of operating at a high operating speed with a reduced power (current) consumption by precharging the potentials of the data lines and the inverted data lines at a potential between a supply potential and a ground potential in the standby mode before at least the retrieval mode.

In order to attain the aforesaid object, the present invention provides an associative memory device comprising:

a memory array comprising a plurality of associative memory cells arranged in rows and columns, and pairs of a data line and an inverted data line, each pair for each column of the memory array;

precharge circuits each provided for each pair of the data line and the inverted data line to precharge the data lines and the inverted data lines to a precharge potential in a standby mode before at least a data retrieval mode; and data line drivers each provided for the each pair of the data line and the inverted data line to drive the data lines and the inverted data lines to one of a HIGH logic level and a LOW logic level at least in the data retrieval mode;

wherein the precharge potential is lower than a supply potential and higher than a ground potential.

Preferably, the associative memory device described above further comprises a data line potential generator to generate and supply the precharge potential to the precharge circuits.

Preferably, each of the data line driver and each of the precharge circuit are united in an integral unit, Preferably, the associative memory device described above further comprises data line level control circuits each provided for the each pair of the data line and the inverted data line to prevent formation of a deviation of absolute values of incremental voltages from the precharge potential in the pair of the data line and the inverted data line.

Preferably, the precharge circuits precharge the data lines and the inverted data lines to the precharge potential also in a standby mode before a read mode; and the data line level control circuits prevents formation of the deviation of the absolute values of the incremental voltages in the pair of the data line and the inverted data line during the read mode.

Preferably, the precharge potential is substantially equal to a middle potential between a supply potential and a ground potential.

Preferably, the associative memory cells include one of a SRAM cell and a ROM cell.

Preferably, both of the each pair of the data line and the inverted data line are connected to all of the cells in the corresponding column of the memory array.

The present invention provides an associative memory device comprising:

a memory array comprising a plurality of associative memory cells arranged in rows and columns, and pairs of a data line and an inverted data line, each pair for each column of the memory array;

precharging means for precharging the data lines and the inverted data lines to a precharge potential in a standby mode before at least a data retrieval mode; and driving means for driving the data lines and the inverted data lines to one of a HIGH logic level and a LOW logic level at least in the data retrieval mode;

wherein the precharge potential is lower than a supply potential and higher than a ground potential.

Preferably, the associative memory device described above further comprises precharge potential generating means for generating and supplying the precharge potential to the precharging means.

Preferably, the driving means and the precharging means are united in an integral unit.

Preferably, the precharge potential is substantially equal to a middle potential between a supply potential and a ground potential.

Preferably, the associative memory cells include one of a SRAM cell and a ROM cell.

The present invention provides an associative memory device comprising:

a memory array comprising a plurality of associative memory cells arranged in rows and columns, and pairs of a data line and an inverted data line, each pair for each column of the memory array;

precharge circuits each provided for each pair of the data line and the inverted data line to precharge the data lines and the inverted data lines to a precharge potential in a standby mode before at least a data retrieval mode; and data line drivers each provided for the each pair of the data line and the inverted data line to drive the data lines and the inverted data lines to one of a HIGH logic level and a LOW logic level at least in the data retrieval mode;

wherein the precharge potential is substantially equal to a middle potential between the HIGH logic level and the LOW logic level.

The associative memory device in accordance with the present invention precharges the data lines and the inverted data lines at a precharge potential between the supply potential and the ground potential, preferably, at a precharge potential equal to about the middle between the supply potential and the ground potential in the standby mode before at least the retrieval mode, preferably, all in the standby mode.

Accordingly, the associative memory device in accordance with the present invention is able to conduct the retrieval operation at a high speed and at a reduced current consumption because the potentials of the data lines and the inverted data lines in the standby mode before the retrieval mode are between the supply potential and the ground potential. Particularly, the operating speed of the associative memory device can be increased to a maximum and the current consumption can be reduced by half when the precharge potential is equal to about the middle of the supply potential and the ground potential.

DETAILED DESCRIPTION OF THE INVENTION

Associative memory devises in preferred embodiments according to the present invention will be described hereinafter with reference to the accompanying drawings.

Figure 1:
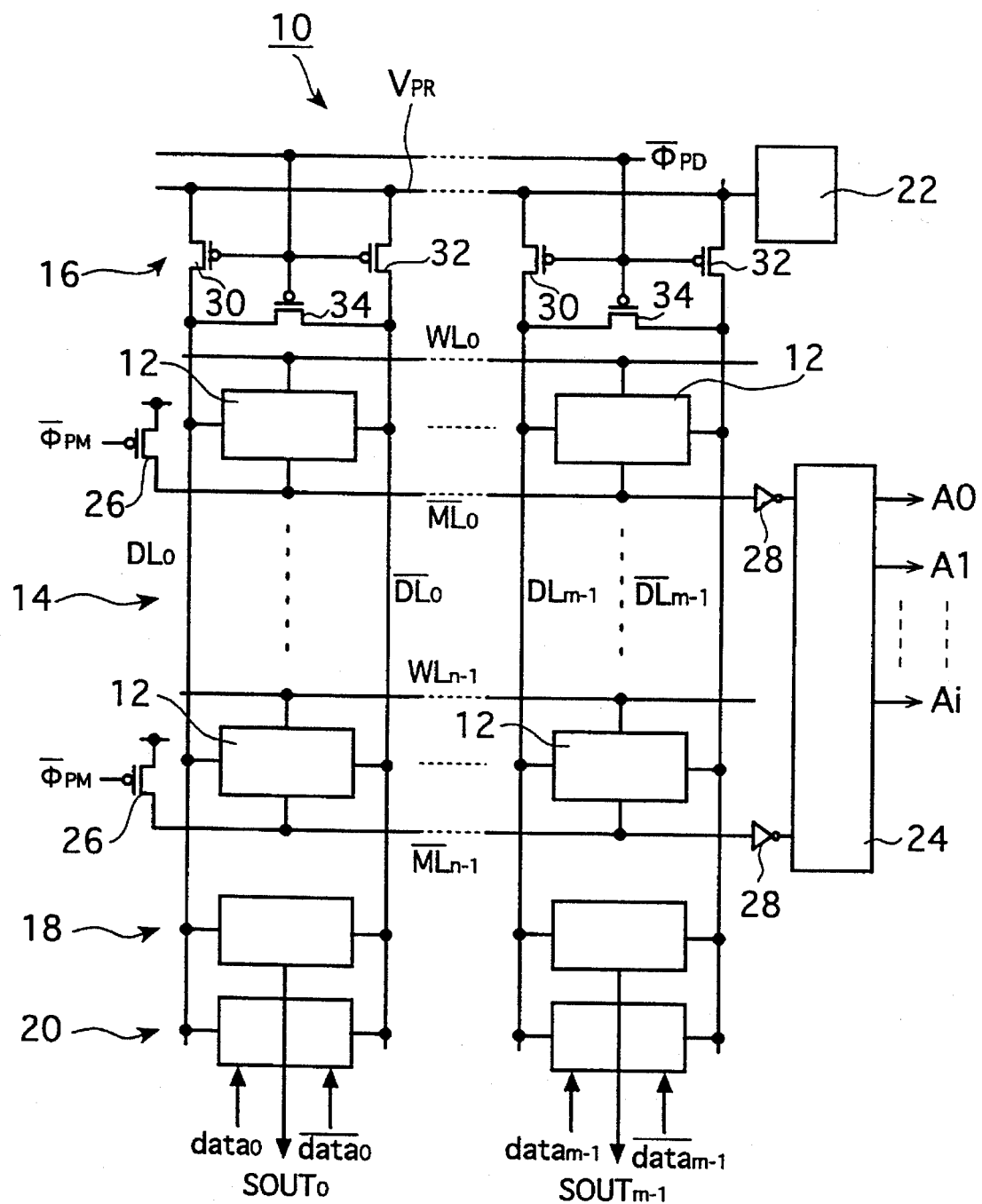
FIG. 1 is a block diagram of an associative memory device in one embodiment according to the present invention.

Referring to FIG. 1 showing an associative memory device 10 in a first embodiment according to the present invention.

The associative memory device 10 comprises a memory array 14 comprising associative memory cells 12 arranged in m bit columns and n word rows, precharge circuits 16 each provided for each column of the associative memory cells 12, sense amplifier 18 each provided for each column of the associative memory cells 12, data line drivers 20 each provided for each column of the associative memory cells 12, a data line potential generator 22, and an encoder 24.

Figure 11:
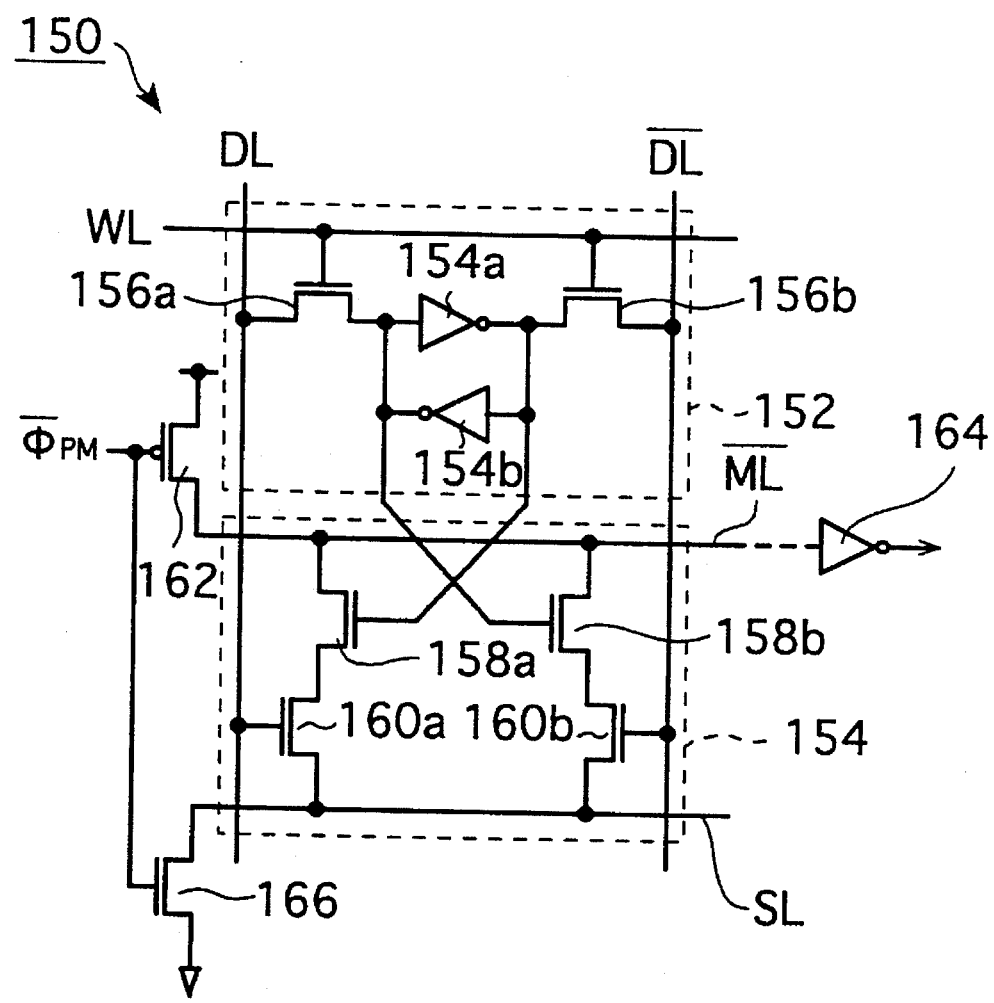
FIG. 11 is a circuit diagram of a prior art associative memory cell by way of example.

Each row of m memory cells forms a word memory. All the cells in each word memory of the memory array 14 are connected to corresponding one of word lines $WL_0$ to $WL_{n-1}$ ($WL_0, \ldots, WL_{n-1}$), and corresponding one of match lines $\overline{ML}_0$ to $\overline{ML}_{n-1}$ ($\overline{ML}_0, \ldots, \overline{ML}_{n-1}$). And all the memory cells in each column are connected to a pair of corresponding one of data lines $DL_0$ to $DL_{m-1}$ ($DL_0, \ldots, DL_{m-1}$), and corresponding one of inverted data lines $\overline{DL}_0$ to $\overline{DL}_{m-1}$ ($\overline{DL}_0, \ldots, \overline{DL}_{m-1}$). Each one of the match lines $\overline{ML}_0$ to $\overline{ML}_{n-1}$ is connected to the drain of corresponding one of PMOSs 26 for precharging the match lines, and is connected through corresponding one of inverters 28 to the encoder 24. The sources of the PMOSs 26 are connected to a power supply, and the gates of the PMOSs 26 are connected to a control line $\overline{\Phi}_{PM}$. The circuit configuration of the associative memory cells 12 of the array memory 14 may be any known type suitable for associative memory devises. The circuit configuration of each of the associative memory cells 12 is the same as that of the prior art previously described with reference to FIG. 11.

The precharge circuits 16 precharges the pair of the data lines $DL_0$ to $DL_{m-1}$ and the inverted data lines $\overline{DL}_0$ to $\overline{DL}_{m-1}$ at a potential lower than a supply potential and higher than a ground potential i.e., at an intermediate potential between the supply potential and the ground potential. Each precharge circuit 16 comprises PMOSs 30, 32 and 34. The drains of the PMOSs 30 and 32 are connected to the corresponding data line DL and the corresponding inverted data line $\overline{DL}$, respectively, and the sources of the PMOSs 30 and 32 are connected to a precharge line $V_{PR}$. The source and the drain of the PMOS 34 are connected to the corresponding data line DL and the corresponding inverted data line $\overline{DL}$, respectively, and the gates of the PMOSs 30, 32 and 34 are shorted and connected collectively to a control line $\overline{\Phi}_{PD}$. The PMOSs 30 and 32 precharge the data line DL and the inverted data line $\overline{DL}$ at the intermediate potential, and the PMOS 34 holds the pair of the data line DL and the inverted data line $\overline{DL}$ at the same potential. The precharge circuits 16 for precharging the data lines $DL_0$ to $DL_{m-1}$ and the inverted data lines $\overline{DL}_0$ to $\overline{DL}_{m-1}$ of the associative memory device 10 in this embodiment may be any suitable known circuits.

The data line potential generator 22 generates a potential for precharging the data lines $DL_0$ to $DL_{m-1}$ and the inverted data lines $\overline{DL}_0$ to $\overline{DL}_{m-1}$ by the precharge circuits 16. and supplies the generated potential to the precharge circuits 16 through the precharge line $V_{PR}$. The data line potential generator may be of any circuit configuration. Preferably, the data line potential generating circuit 22 is able to adjust the potential when the supply potential or the ground potential varies due to some causes.

Figure 2A:
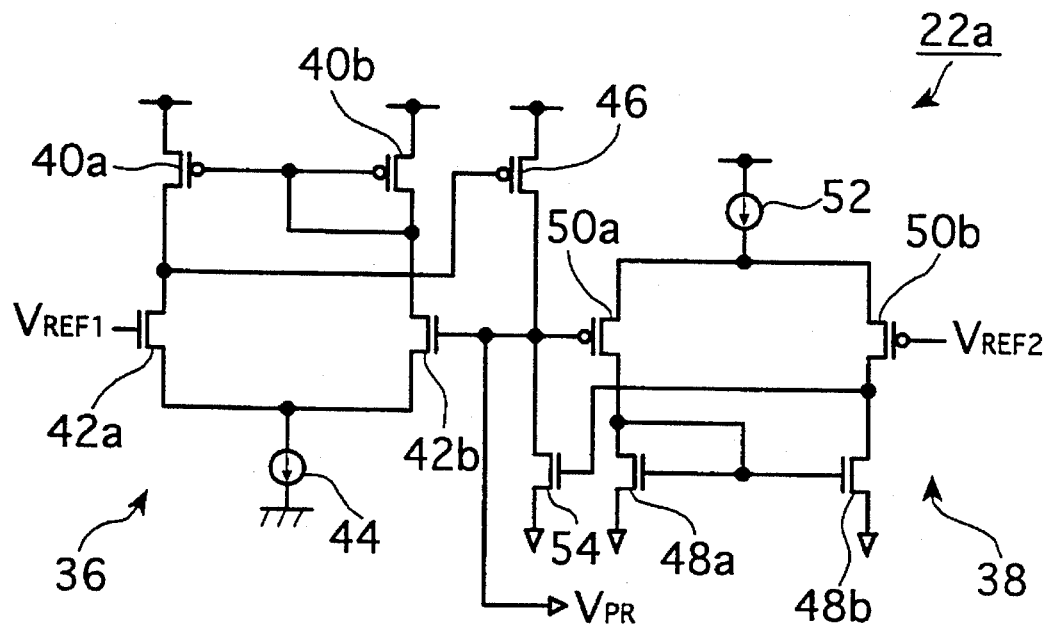
FIGS. 2(a) and 2(b) are circuit diagrams of data line potential generators applicable to the associative memory device of FIG. 1.
Figure 2B:
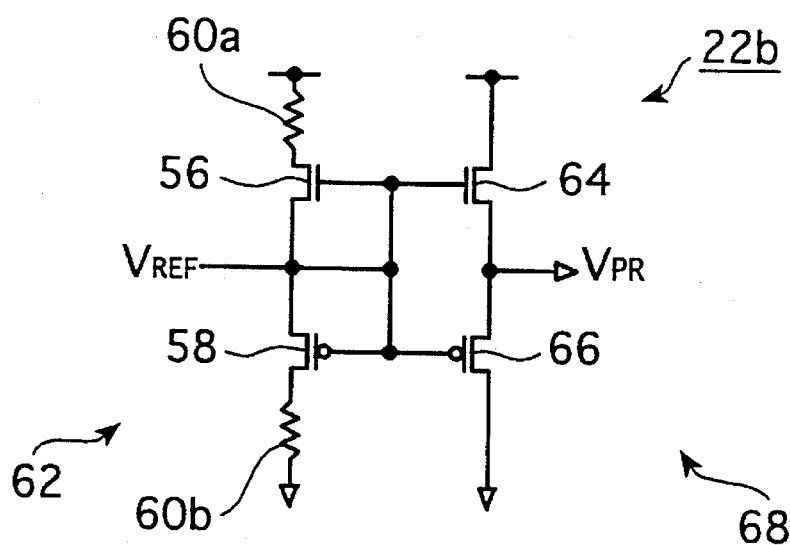

FIGS. 2(a) and 2(b) show data line potential generators applicable to the associative memory device of the present invention.

A data line potential generator 22a shown in FIG. 2(a) is of a current mirror type comprising a high-potential generating circuit 36 and a low-potential generating circuit 38.

The high-potential generating circuit 36 comprises PMOSs 40a and 40b as current mirror type loads, NMOSs 42a and 42b for receiving a differential voltage signal, a constant-current source 44 and a PMOS 46 for charging. The sources of the PMOSs 40a and 40b are connected to a power supply, and the gates of the PMOSs 40a and 40b are shorted and connected to the drain of the PMOS 40b. The gates of the NMOSs 42a and 42b are connected to a reference potential line $V_{REF1}$ and the precharge line $V_{PR}$, respectively, the drains of the NMOSs 42a and 42b are connected to the drains of the PMOSs 40a and 40b, respectively, and the sources of the NMOSs 42a and 42b are shorted and are connected to the constant-current source 44 connected to a ground. The source of the PMOS 46 is connected to the power supply, the drain of the PMOS 46 is connected to the precharge line $V_{PR}$, and the gate of the PMOS 46 is connected to the drain of the NMOS 42a.

Similarly, the low-potential generating circuit 38 comprises NMOSs 48a and 48b as current mirror type loads, PMOSs 50a and 50b for receiving a differential voltage signal, a constant-current source 52 and a NMOS 54 for discharging. The sources of the NMOSs 48a and 48b are connected to the ground, and the gates of the NMOSs 48a and 48b are shorted and connected to the drain of the NMOS 48a. The gates of the PMOSs 50a and 50b are connected to the precharge line $V_{PR}$ and a reference potential line $V_{REF2}$, respectively, the drains of the PMOSs 50a and 50b are connected to the drains of the NMOSs 48a and 48b, respectively, and the sources of the PMOSs 50a and 50b are shorted and are connected to the constant-current source 52 connected to the power supply. The source of the NMOS 54 is connected to the ground, the drain of the NMOS 54 is connected to the precharge line $V_{PR}$, and the gate of the NMOS 54 is connected to the drain of the PMOS 50b.

A potential proportional to the supply potential is supplied to the reference potential lines $V_{REF1}$ and $V_{REF2}$ of the data line potential generator 22a. Therefore, the potential of the reference potential lines $V_{REF1}$ and $V_{REF2}$ varies according to the supply potential.

When supply potential rises and the potential of the reference potential line $V_{REF1}$ rises accordingly, the gate voltage of the NMOS 42a rises and the current driving ability $g_m$ (or the drain current) of the NMOS 42a becomes greater than that of the NMOS 42b and, consequently, the drain potential of the NMOS 42a, i.e., the gate voltage of the PMOS 46, drops, and the current driving ability $g_m$ of the PMOS 46 increases according to the drain potential of the NMOS 42a. Consequently, the precharge line $V_{PR}$ is charged and the potential of the precharge line $V_{PR}$ is adjusted according to the rise of the supply potential.

When the supply potential drops and the potential of the reference potential line $V_{REF2}$ drops accordingly, the gate voltage of the PMOS 50b drops and the current driving ability $g_m$ of the PMOS 50b becomes greater than that of the PMOS 50a and, consequently, the drain potential of the PMOS 50b rises, and the current driving ability $g_m$ of the NMOS 54 increases according to the drain potential of the PMOS 50b as the gate voltage of the NMOS 54. Consequently, the precharge line $V_{PR}$ is discharged and the potential of the precharge line $V_{PR}$ is adjusted according to the drop of the supply potential.

Thus, the data line potential generator 22a maintains the precharge line $V_{PR}$ at a desired potential even if the supply potential or the ground potential varies.

A data line potential generator 22b shown in FIG. 2(b) comprises a level variation detecting circuit 62 comprising an NMOS 56, a PMOS 58 and resistors 60a and 60b, and a precharge line driver 68 comprising an NMOS 64 and a PMOS 66. The drains of the NMOS 56 and the PMOS 58 are connected through the resistors 60a and 60b to the power supply and a ground, respectively, and the sources and the gates of the NMOS 56 and the PMOS 58 are shorted and connected to a reference potential line $V_{REF}$. The drains of the NMOS 64 and the PMOS 66 are connected to a power supply and a ground, respectively, the sources of the NOMS 64 and the PMOS 66 are shorted and connected to the precharge line $V_{PR}$, and the gates of the NOMS 64 and the PMOS 66 are shorted and connected to the reference potential line $V_{REF}$.

In this data line potential generator 22b, the level variation detecting circuit 62 detects the variation of the potential of the reference potential line $V_{REF}$, and adjusts the potential of the precharge line $V_{PR}$ by the NMOS 64 or the PMOS 66 so that the potential of the precharge line $V_{PR}$ is maintained at the potential of the reference potential line $V_{REF}$. Although the data line potential generator 22 may be either the data line potential generator 22a or 22b, the data line potential generator 22 need not be limited to the data line potential generator 22a or 22b. The data line potential generator 22 may be of any circuit configuration. Preferably, the data line potential generator 22 is capable of adjusting the potentials of the precharge line $V_{PR}$, i.e., the precharge potential of the data lines $DL_0$ to $DL_{m-1}$ and the inverted data lines $\overline{DL_0}$ to $\overline{DL_{m-1}}$, according to the variation of the potential of the power supply or the ground.

Though it is preferable to provide the data line potential generator in the associative memory device, it is also possible to provide the data line potential generator out side of the associative memory device and to supply the generated potential to the associative memory device.

Each of the data line drivers 20 drives the corresponding pair of the data lines $DL_0$ to $DL_{m-1}$ and the inverted data lines $\overline{DL_0}$ to $\overline{DL_{m-1}}$, of the potential of the power supply or the ground.

Though it is preferable to provide the data line potential generator in the associative memory device, it is also possible to provide the data line potential generator out side of the associative memory device and to supply the generated potential to the associative memory device.

Figure 3:
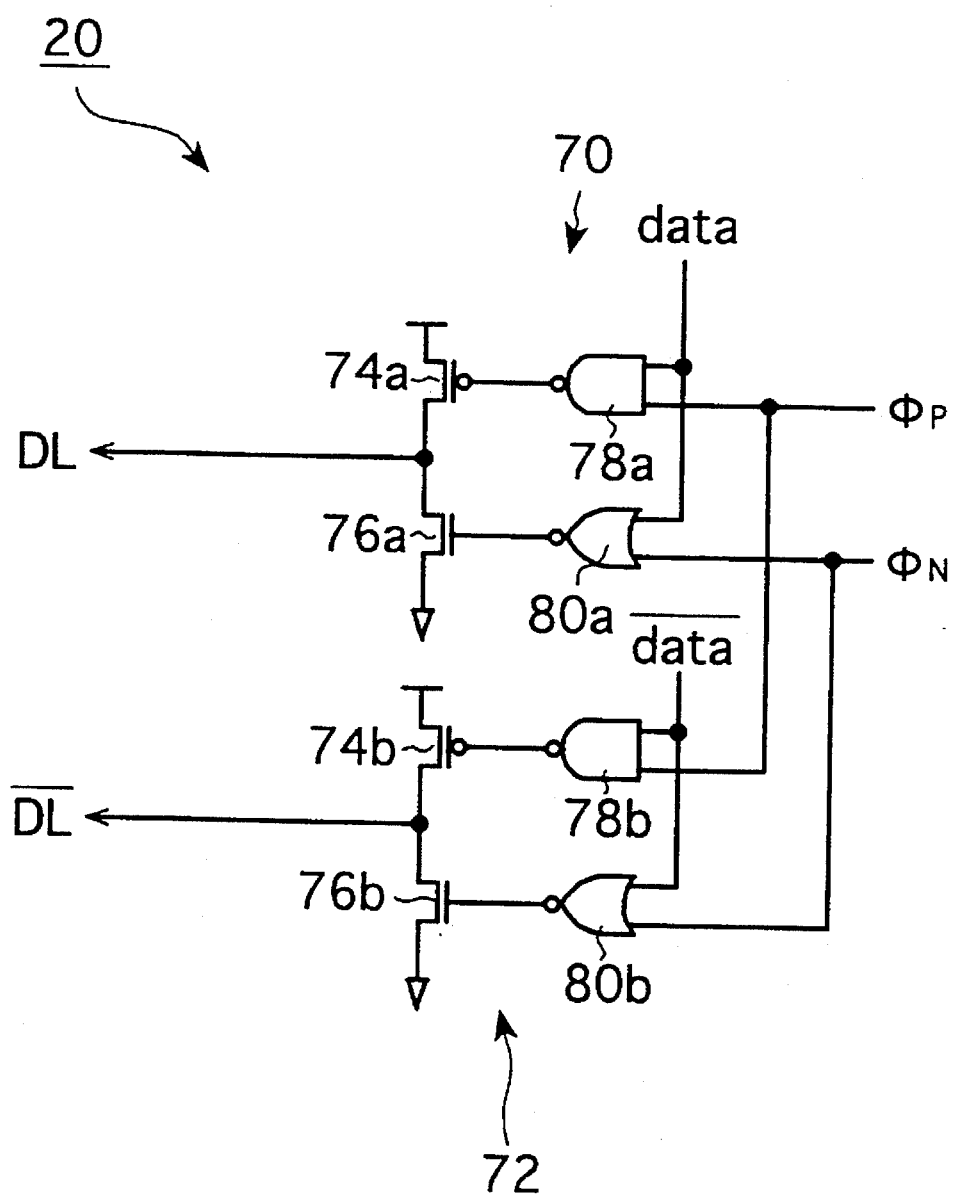
FIG. 3 is a circuit diagram of a data line driver included in the associative memory device of FIG. 1.

Each of the data line drivers 20 drives the corresponding pair lined $DL_0$ to $DL_{m-1}$ and the inverted data lines $\overline{DL_0}$ to $\overline{DL_{m-1}}$, according to the mode of operation. One of the pair of data input lines $data_0$ to $data_{m-1}$ and inverted data input lines $\overline{data_0}$ to $\overline{data_{m-1}}$ for transferring write data or retrieval data, is connected to each one of the data line drivers 20. As shown, by way of example, in FIG. 3, each data line driver 20 comprises a data line drive section 70 and an inverted data line drive section 72.

The data line drive section 70 comprises a PMOS 74a, an NMOS 76a, a NAND gate 78a and a NOR gate 80a. The sources of the PMOS 74a and the NMOS 76a are connected to the power supply and the ground, respectively, the drains of the PMOS 74a and the NMOS 76a are shorted and connected to the data line DL, and the gates of the PMOS 74a and the NMOS 76a are connected to the outputs of the NAND gate 78a and the NOR gate 80a, respectively. One of the inputs of the NAND gate 78a and one of the inputs of the NOR gate 80a are connected to a data input line, and the other inputs of the NAND gate 78a and the NOR gate 80a are connected to a control lines $\Phi_p$ and $\Phi_n$, respectively.

The inverted data drive section 72 comprises a PMOS 74b, an NMOS 76b, a NAND gate 78b and a NOR gate 80b.

The sources of the PMOS 74b and the NMOS 76b are connected to the power supply and the ground, respectively, the drains of the PMOS 74b and the NMOS 76b are shorted and connected to the inverted data line $\overline{DL}$, and the gates of the PMOS 74b and the NMOS 76b are connected to the outputs of the NAND gate 78b and the NOR gate 80b, respectively. One of the inputs of the NAND gate 78b and one of the inputs of the NOR gate 80b are connected to an inverted data input line $\overline{data}$, and the other inputs of the NAND gate 78b and the NOR gate 80b are connected to the control lines $\Phi_p$ and $\Phi_n$, respectively.

The standby mode, the read mode, the write mode and the retrieval mode of the data line drivers 20 will be described below.

In the standby mode, the control lines $\Phi_p$ and $\Phi_n$ are LO and HIGH, respectively, and the data input line data and the inverted data input line $\overline{data}$ may be either HIGH or LOW. The outputs of the NAND gates 78a, 78b and the NOR gates 80a, 80b are HIGH and LOW, respectively, and the PMOSs 74a, 74b and the NMOSs 76a, 76b are OFF. Consequently, the data line DL and the inverted data line $\overline{DL}$ are in a high-impedance state. Since the data line DL and the inverted data line $\overline{DL}$ are charged at the intermediate potential by the precharge circuit 16 in the standby mode, the outputs of the data line driver 20 must be in a high-impedance state.

In the read mode, both the control lines $\Phi_P$ and $\Phi_N$ are set HIGH, and both the data input line data and the inverted data input line $\overline{data}$ are set to LOW. The outputs of the NAND gates 78a, 78b and the NOR gates 80a, 80b go HIGH and LOW, respectively and, consequently, the PMOSs 74a 74b and the NMOSs 76a, 76b turn OFF. Therefore, the data line DL and the inverted data line $\overline{DL}$ are set to a high-impedance state. Since the word memory specified by address provide data and inverted data on the data lines $DL_0$ to $DL_{M-1}$ and the inverted data lines $\overline{DL}_0$ to $\overline{DL}_{m-1}$, respectively, during the read mode, the outputs of the data line driver 20 must be in a high-impedance state.

In the write mode, the control lines $\Phi_P$ and $\Phi_N$ are set to HIGH and LOW, respectively, and write data and inverted write data are provided on the data input line data and the inverted data input line $\overline{data}$. The NAND gates 78a, 78b and the NOR gates 80a, 80b become active, and inverted potential of the write data provided on the data input line data appears on the gates of the PMOS 74a and the NMOS 76a. While, inverted potential of the inverted write data provided on the inverted data input line $\overline{data}$ appears on the gates of the PMOS 74b and the NMOS 76b. Consequently, the data line DL and the inverted data line $\overline{DL}$ are set at potentials corresponding to the data provided on the data input line data and to the inverted data provided on the inverted data input line $\overline{data}$, respectively. Since write data are written to the word memory specified by address through the data lines $DL_0$ to $DL_{m-1}$ and the inverted data lines $\overline{DL}_0$ to $\overline{DL}_{m-1}$ during the write mode, the data lines $DL_0$ to $DL_{m-1}$ and the inverted data lines $\overline{DL}_0$ to $\overline{DL}_{m-1}$ are set at potentials corresponding to the write data and inverted write data, respectively.

The retrieval mode is entirely the same as the foregoing write mode, except that the data lines $DL_0$ $DL_{m-1}$ and the inverted data lines $\overline{DL}_0$ to $\overline{DL}_{m-1}$ are driven by retrieval data instead of the write data, and the description thereof will be omitted.

The data line drivers 20 may any known circuits and there is no particular restriction thereon, provided that the data line driver are capable of properly driving the data lines $DL_0$ to $DL_{m-1}$ and the inverted data lines $\overline{DL}_{m-1}$.

The sense amplifiers 18 amplify differential voltage signals read from the specified word memory and provided on the data lines $DL_0$ to $DL_{m-1}$ and the inverted data lines $\overline{DL}_0$ to $\overline{DL}_{m-1}$, and provide output signals $SOUT_0$ to $SOUT_{m-1}$. FIGS. 4 (a) and 4 (b) show the circuit configurations of sense amplifiers applicable to the present invention.

Shown in FIG. 4 (a) is a latch type sense amplifier 18a applicable to the present invention comprising PMOSs 82, 86 and 90, NMOSs 84, 88 and 92, and a NOR gate 94. The PMOS 82 and the NMOS 84, and the PMOS 86 and the NMOS 88 form a pair of inverters, and the respective inputs and outputs are cross-coupled. The outputs of the inverters are connected to the data line DL and the inverted data line $\overline{DL}$, respectively. The sources of the PMOS 90 and the NMOS 92 are connected to the power supply and the ground, respectively, the gates of the PMOS 90 and the NMOS 92 are connected to sense amplifier enable lines $\overline{SEN}$ and SEN, respectively, and the drains of the PMOS 90 and the NMOS 92 are connected to the sources of the PMOSs 82 and 86 and the sources of the NMOSs 84 and 88, respectively. One of the inputs of the NOR gate 94 is connected to the inverted data line $\overline{DL}$ and the other input of the same is connected to an output enable line $\overline{\Phi}_{OE}$, and the output of the NOR gate 94 is connected to a data output line SOUT.

In the latch type sense amplifier 18a in the standby mode, the sense amplifier enable lines $\overline{SEN}$ and SEN are set to HIGH and LOW, respectively, the output enable line $\overline{\Phi}_{OE}$ is set to HIGH, and the data line DL and the inverted data line $\overline{DL}$ are charged at the precharge potential. When data are provided from a specified memory cell on the data line DL and the inverted data line $\overline{DL}$, the potentials of the data line DL and the inverted data line $\overline{DL}$ change according to the data provided thereon. The differential voltage signal that appears between the data line DL and the inverted data line $\overline{DL}$ is amplified by gradually raising and lowering the potentials of the sense amplifier enable lines SEN and $\overline{SEN}$, respectively. Then, the sense amplifier enable lines $\overline{SEN}$ and SEN are set at the ground potential and the supply potential, respectively. Consequently, the differential voltage signal is amplified to a maximum amplitude and the amplified signal is latched by the pair of inverters. Then, output enable line $\overline{\Phi}_{OE}$ is set to LOW and the amplified and latched inverted data signal is inverted by the NOR gate 94 to output the read data on the data output line SOUT.

Figure 4A:
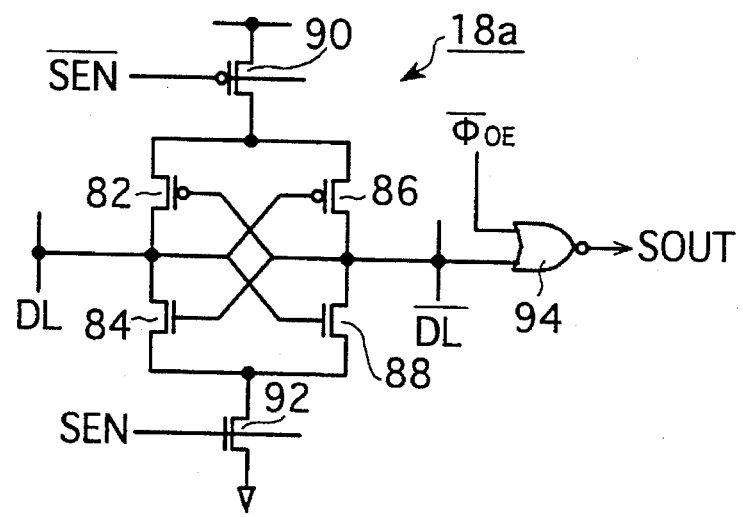
FIGS. 4(a) and 4(b) are circuit diagrams of sense amplifiers applicable to the associative memory device of FIG. 1.
Figure 4B:
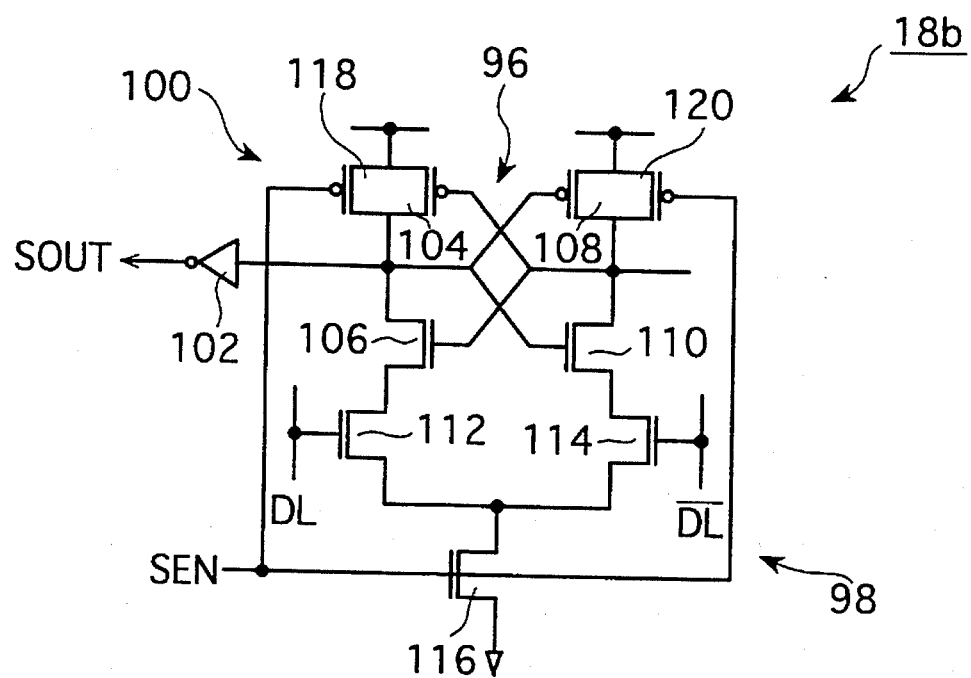

Shown in FIG. 4(b) is a current detection type sense amplifier 18b comprising a current drive type latch circuit 96, a current drive circuit 98, a precharge circuit 100 and an inverter 102. The current drive type latch circuit 96 comprises PMOSs 104 and 108 and NMOSs 106 and 110. The PMOS 104 and the NMOS 106, and the PMOS 108 and the NMOS 110 form a pair of inverters. The inputs and the outputs of the pair of inverters are cross-coupled. The sources of the PMOSs 104 and 108 are connected to the power supply. The current drive circuit 98 comprises NMOSs 112, 114 and 116. The gates of the NMOSs 112 and 114 are connected to the data line DL and the inverted data line $\overline{DL}$, respectively, the drains of the NMOSs 112 and 114 are connected to the sources of the NMOSs 106 and 110 of the current drive type latch circuit 96, respectively, and the sources of the NMOSs 112 and 114 are shorted and connected to the drain of the NMOS 116. The gate of the NMOS 116 is connected to the sense amplifier enable line SEN, and the source of the NMOS 116 is grounded. The precharge circuit 100 comprises PMOSs 118 and 120. The sources of the PMOSs 118 and 120 are connected to the power supply, the gates of the PMOSs 118 and 120 are connected to the sense amplifier enable line SEN, and the drains of the PMOSs 118 and 120 are connected to the drains of the PMOSs 104 and 108 of the current drive latch circuit 96, respectively. The input of the inverter 102 is connected to the drain of the PMOS 104 of the current drive type latch circuit 96, and the output of the PMOS 104 is connected to the data output line SOUT.

In the standby mode, the sense amplifier enable line SEN is set to LOW, and both the data line DL and the inverted data line $\overline{DL}$ are charged at the precharge potential, that is, both the PMOSs 118 and 120 of the precharge circuit 100 are turned ON to precharge the drains of the PMOSs 104 and 108 of the current drive type latch circuit 96 at the supply potential.

In the read mode, the data stored in a specified memory cell is provided on the data line DL and the inverted data line $\overline{DL}$, and the potentials of the data line DL and the inverted data line $\overline{DL}$ change according to the provided data. Subsequently, the sense amplifier enable line SEN is set to HIGH. Then, the NMOS 116 of the current drive circuit 98 turns ON and the current driving abilities $g_m$ of the NMOSs 112 and 114 change according to the potentials of the data line DL and the inverted data line $\overline{DL}$, respectively. Consequently, the charges on the drains of the PMOSs 104 and 108 of the current drive type latch circuit 96 are discharged through the NMOSs 106, 112 and 116, and the NMOSs 110, 114 and 116, respectively. In this period, the charge on the drain of the PMOS 104 of the current drive type latch circuit 96 is discharged faster than that on the drain of the PMOS 108 if the potential of the data line DL is higher than that of the inverted data line $\overline{DL}$, or vice versa. And the provided data is amplified and latched at a high speed. And the latched data is inverted by the inverter 102 and output on the data output line SOUT.

The sense amplifier 18 of the associative memory device 10 need not be limited to those shown in FIGS. 4(a) and 4(b), but may be any types of known sense amplifiers.

The encoder 24 encodes addresses of the word memories detected by match retrieval, and outputs the encoded addresses on address lines $A_o$ to $A_i$ in predetermined order of priority.

Figure 5:
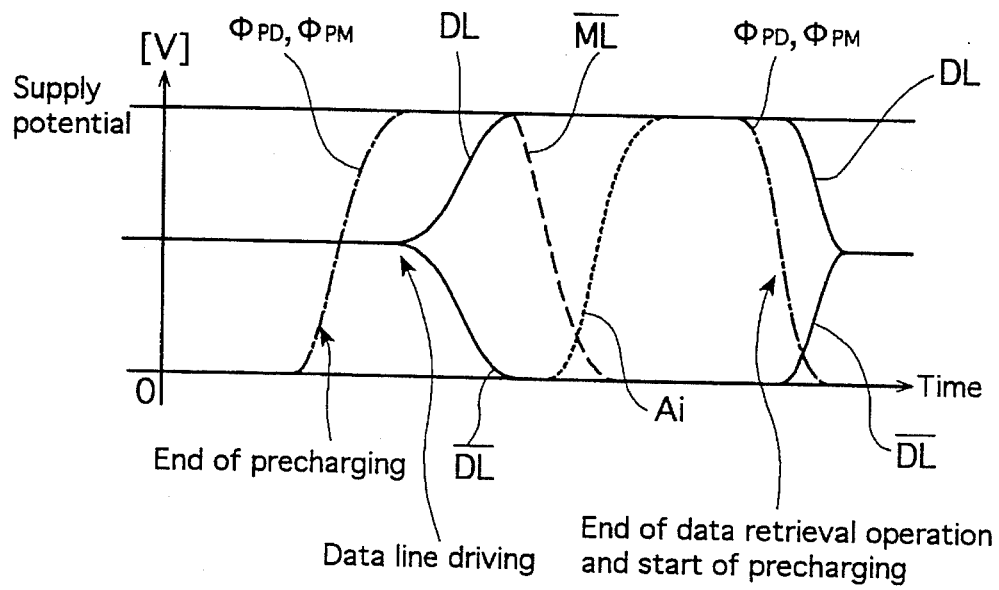
FIG. 5 is a timing diagram for assistance in explaining the associative memory device of FIG. 1.

The associative memory device 10 of the present invention thus constructed carries out the aforesaid data read operation, the data write operation and the data retrieval operation explained in connection with the description of the related art except mode transition. Transition from the standby mode to the retrieval mode for the data retrieval operation and transition from the retrieval mode to the standby mode will be described hereinafter with reference to a timing diagram shown in FIG. 5.

In the standby mode, all the word lines $WL_o$ to $WL_{n-1}$ are LOW, the outputs of the data line drivers 20 are in a high-impedance state, and the control lines $\overline{\Phi}_{PD}$ and $\overline{\Phi}_{PM}$ are LOW. The data lines $DL_o$ to $DL_{m-1}$ and the inverted data lines $\overline{DL}_o$ to $\overline{DL}_{m-1}$ are precharged at the intermediate potential between the supply potential and the ground potential by the precharge circuits 16, and the match lines $\overline{ML}_o$ to $\overline{ML}_{n-1}$ are set to HIGH, i.e., precharged at the supply potential, by the PMOSs 26. In the following description, the data lines $DL_o$ to $DL_{m-1}$ and the inverted data lines $\overline{DL}_o$ to $\overline{DL}_{m-1}$ are supposed to be precharged at about the middle potential between the supply potential and the ground potential. As mentioned above, the data line potential generator 22 supplies the precharge potential through the precharge line $V_{PR}$. The precharge circuits 16 precharge the data lines $DL_o$ to $DL_{m-1}$ and the inverted data lines $\overline{DL}_o$ to $\overline{DL}_{m-1}$ at the precharge potential.

A command to start the data retrieval operation is given after retrieval data has been entered to cause transition from the standby mode to the retrieval mode. Then, the control line $\overline{\Phi}_{PD}$ goes HIGH, precharging of the data lines $DL_o$ to $DL_{m-1}$ and the inverted data lines $\overline{DL}_o$ to $\overline{DL}_{m-1}$ by the precharge circuits 16 are ended, and the data line drivers 20 drive the retrieval data and the inverted retrieval data to the data lines $DL_o$ to $DL_{m-1}$ and the inverted data lines $\overline{DL}_o$ to $\overline{DL}_{m-1}$, respectively. At the same time, control line $\overline{\Phi}_{PM}$ goes HIGH and precharging of the match lines $\overline{ML}_o$ to $\overline{ML}_{n-1}$ are ended and, consequently, all the word memories starts simultaneously a matching operation for matching stored data with the retrieval data. The encoder 24 sends out the addresses of the word memories storing the stored data matching the retrieval data which are detected by the data retrieval operation on the address lines $A_0$ to $A_1$ in predetermined order of priority.

Upon the completion of the data retrieval operation, the outputs of the data line drivers 20 become a high-impedance state, and both the control lines $\overline{\Phi}_{PD}$ and $\overline{\Phi}_{PR}$ go LOW. Consequently, the data lines $DL_0$ to $DL_{m-1}$ and the inverted data lines $\overline{DL}_0$ to $\overline{DL}_{m-1}$ are precharged at the substantially middle potential between the supply potential and the ground potential by the precharge circuits 16. And match lines $\overline{ML}_0$ to $\overline{ML}_{n-1}$ are precharged by the PMOSs 26 and go HIGH, and the associative memory device 10 is returned to the standby mode. During transition from the standby mode to the retrieval mode and transition from the retrieval mode to the standby mode. the data lines $DL_0$ to $DL_{m-1}$ and the inverted data lines $\overline{DL}_0$ to $\overline{DL}_{m-1}$ are driven from the substantially middle potential between the supply potential and the ground potential to the potentials of the retrieval data, i.e., one of the supply potential and the ground potential, and then to the substantially middle potential between the supply potential and the ground potential by precharging.

However, since one of the each pair of the data line and the inverted data line is driven to the supply potential and the other of the pair is driven to the ground potential during the data retrieval operation, the data lines $DL_0$ to $DL_{m-1}$ and the inverted data lines $\overline{DL}_0$ to $\overline{DL}_{m-1}$ can be precharged at the substantially middle potential between the supply potential and the ground potential simply by charge re-distribution by shorting each of the data line and the corresponding data line by the precharge circuits 16 during transition from the retrieval mode to the standby mode. That is, it is unnecessary to charge or discharge the data lines $DL_0$ to $DL_{m-1}$ and the inverted data lines $\overline{DL}_0$ to $\overline{DL}_{m-1}$ during the transition from the retrieval mode to the standby mode. Therefore, the power consumption of the associative memory device 10 is reduced by half that of the conventional associative memory device.

For example, in a conventional associative memory device, the data lines $DL_0$ to $DL_{m-1}$ and the inverted data lines $\overline{DL}_0$ to $\overline{DL}_{m-1}$ are precharged at the supply potential in the standby mode, either one of the pair of the data line or the inverted data line is discharged to the ground potential for the data retrieval operation, and the discharged data line or the discharged inverted data line is charged at the supply potential when changing the associative memory device from the retrieval mode to the standby mode. Therefore, a current expressed by the following equation must be supplied to each pair of the data line DL and the inverted data line $\overline{DL}$ for one data retrieval cycle, that is, for changing the associative memory device from the standby mode to the retrieval mode and, then, to the standby mode.

$$i = \frac{C_{DL} \cdot V_{DD}}{\Delta t} \quad (1)$$

where i is current, $C_{DL}$ is the capacitance of the data line and the inverted data line, $V_{DD}$ is the supply voltage and $\Delta t$ is the cycle time.

On the other hand, the present invention precharge the data line and the inverted data line at the substantially middle potential between the supply potential and the ground potential in the standby mode, either one of the pair of the data line and the inverted data line is charged to the supply potential and the other is discharged to the ground potential for the data retrieval operation, and the pair of data line and the inverted data line is shorted to re-distribute the charge when changing the associative memory device from the retrieval mode to the standby mode so that both the pair of data line and the inverted data line are precharged at the substantially middle potential between the supply potential and the ground potential. Thus, according to the present invention, since the data lines $DL_0$ to $DL_{m-1}$ and the inverted data lines $\overline{DL}_0$ to $\overline{DL}_{m-1}$ need not be charged or discharged when returning the associative memory device from the retrieval mode to the standby mode, and only a current expressed by the following equation need to be supplied to each pair of the data line DL and the inverted data line $\overline{DL}$ for one data retrieval cycle.

$$i = \frac{C_{DL} \cdot V_{DD}/2}{\Delta t} \quad (2)$$

The current i of the equation (2) is half the current i of the equation (1). Thus, the associative memory device of the present invention only needs half the current needed by the conventional associative memory device.

In the conventional associative memory device, either one of the data line or the inverted data line needs to be discharged from the supply potential to the ground potential before starting the data retrieval operation. On the other hand, according to the present invention, either one of the pair of the data line or the inverted data line needs to be discharged from the substantially middle potential between the supply potential and the ground potential to the ground potential and the other one of the pair needs to be charged up from the substantially middle potential between the supply potential and the ground potential to the supply potential. Therefore, the transition from the standby mode to the retrieval mode can be accomplished in a reduced time. And a mode transition from the retrieval mode to the standby mode can be accomplished likewise in a reduced time. Therefore, the speed of the data retrieval operation is increased.

Although the associative memory device of the present invention has a satisfactory power (current) consumption reducing effect for the same reason even if the data lines $DL_0$ to $DL_{m-1}$ and the inverted data lines $\overline{DL}_0$ to $\overline{DL}_{m-1}$ are precharged at a (an intermediate) potential other than the substantially middle potential between the supply potential and the ground potential, naturally, precharging the data lines $DL_0$ to $DL_{m-1}$ and the inverted data lines $\overline{DL}_0$ to $\overline{DL}_{m-1}$ at the substantially middle potential exerts the highest power consumption reducing effect. Although the power consumption reducing effect when carrying out the data retrieval operation has been explained, the power consumption reducing effect can be similarly realized when carrying out the data read operation and the data write operation if the data lines $DL_0$ to $DL_{m-1}$ and the inverted data lines $\overline{DL}_0$ to $\overline{DL}_{m-1}$ are also precharged at the substantially middle potential between the supply potential and the ground potential in the standby mode before the read and write modes.

It is also preferable to precharge the match line $\overline{ML}$, at a potential lower than the supply potential and higher than the threshold voltage of NMOS transistor at the input of the inverter 28. With this technique, the current consumption due to the swing of the potential of the match line $\overline{ML}$ during the retrieval operation is reduced, the time necessary to precharge the match line $\overline{ML}$ to the precharge potential in the standby mode before the retrieval mode is reduced, and the time necessary to discharge the match line $\overline{ML}$ of the word memory in which the stored data do not match the retrieval data in the retrieval mode. Especially, the reduction of the time necessary to discharge the match line $\overline{ML}$ is very effective to reduce the total time necessary for the retrieval operation. When only one of the bit of the stored data is not the same as the corresponding bit of the retrieval data, only one retrieval unit in the word memory discharges the total charge in the match line $\overline{ML}$. Thus, if the match line $\overline{ML}$ is charged to the supply potential, unsatisfactory long time is needed to discharge the match line $\overline{ML}$. On the other hand, if the match line $\overline{ML}$ is precharged at a potential lower than the supply potential and higher than the threshold voltage of NMOS transistor at the input of the inverter 28, the charge in the match line $\overline{ML}$ can be discharged in a shorter time.

It is possible to supply the precharge potential from the data line potential generator 22 to the source of the PMOS 26. It is also possible to provide a separate potential generator to supply the precharge potential to the source of the PMOS 26 or to other precharge circuits for the match lines. In this case, it is preferable to supply a precharge potential lower than the half of the supply potential so that the discharging time is effectively decreased.

Figure 6:
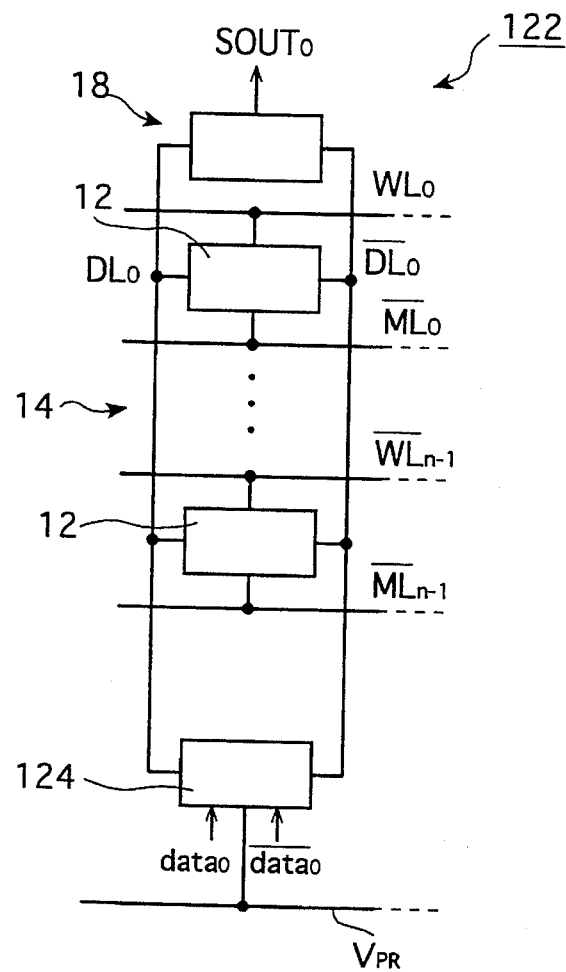
FIG. 6 is a block diagram of an associative memory device in another embodiment according to the present invention.

FIG. 6 is a block diagram of an associative memory device 122 in a second embodiment according to the present invention. The associative memory device 10 shown in FIG. 1 only in that the associative memory device 122 is not provided with the associative memory device 122 is not provided with separate circuits corresponding to the precharge circuits 16, and is provided with data line drivers 124 of a circuit configuration different from that of the data line drivers 20 of the associative memory device 10, and the detailed description thereof will be omitted.

Figure 7:
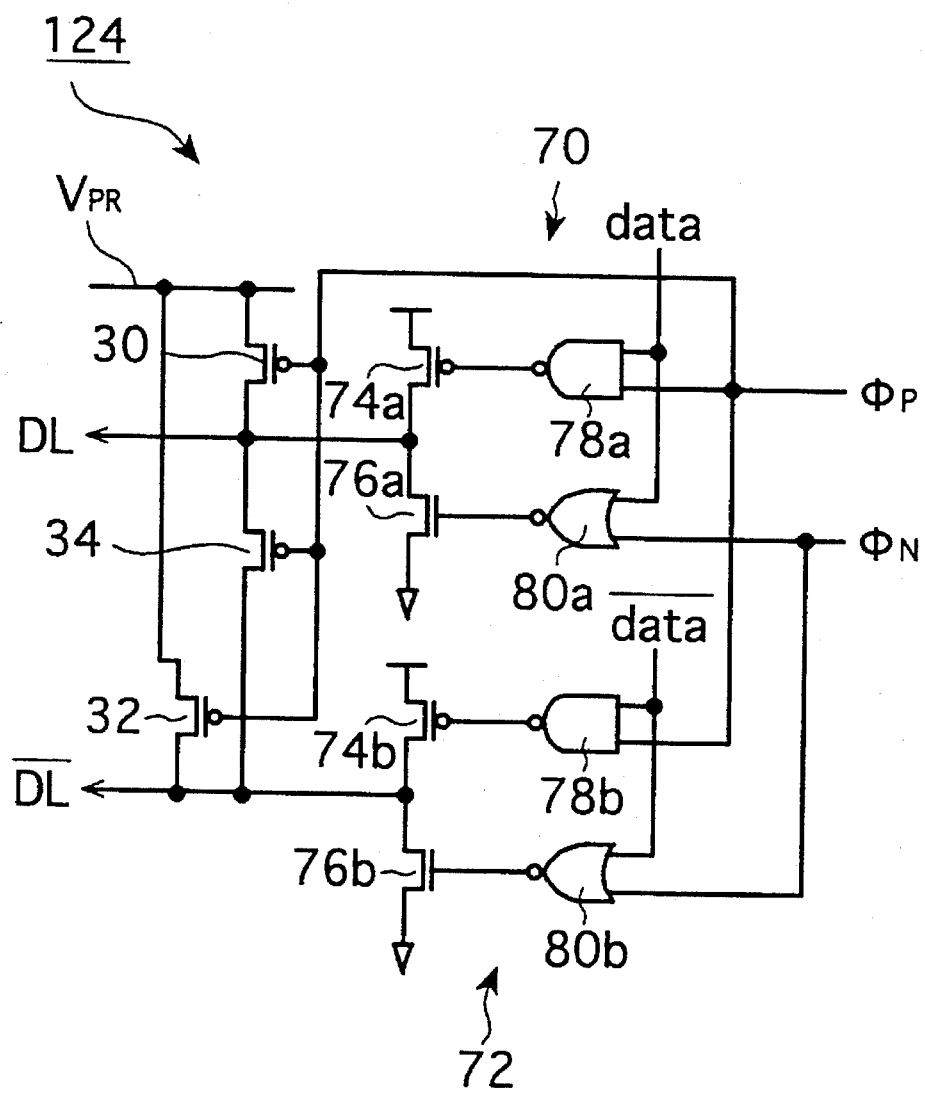
FIG. 7 is a circuit diagram of a data line driver applicable to the associative memory device of FIG. 6.

The data line driver 124 of the associative memory device 122 has the function of the precharge circuit 16 of the associative memory device of FIG. 1. Referring to FIG. 7, the data line driver 124 comprises, in addition to the components as those of the data driver 20 of FIG. 3, PMOSs 30 and 32 for precharging the data line DL and the inverted data line $\overline{DL}$, and a PMOS 34 for shorting the data line DL and the inverted data line $\overline{DL}$. The sources of the PMOSs 30 and 32 are connected to the precharge line $V_{PR}$, the drains of the PMOSs 30 and 32 are connected to the data line DL and the inverted data line $\overline{DL}$, respectively, and the gates of the PMOSs 30 and 32 are shorted and connected to the control line $\Phi_P$. The functions of the data line driver 124 for the data read operation, the data write operation and the data retrieval operation are entirely the same as those of the data line driver 20 of FIG. 3.

In the standby mode, the control lines $\Phi_P$ and $\Phi_N$ are set to LOW and HIGH, respectively. The data input line data and the inverted data input line $\overline{data}$ may be set to either HIGH or LOW. Therefore, the outputs of the NAND gates 78a, 78b and the outputs of the NOR gates 80a, 80b are HIGH and LOW, respectively. Consequently, the PMOSs 74a, 74b and the NMOSs 76a, 76b are turned OFF and the control line $\Phi_P$ goes LOW. Consequently, all the PMOSs 30, 32 and 34 are turned ON, and the data line DL and the inverted data line $\overline{DL}$ are charged at the potential of the precharge line $V_{PR}$, i.e., an intermediate potential between the supply potential and the ground potential, and the data lines DL and the inverted data line $\overline{DL}$ are shorted.

Thus, the data line driver 124 having the functions of the precharge circuit 16 enables the associative memory device 122 to be formed in a compact design and provides an additional margin for operation.

As mentioned above, the data lines $DL_0$ to $DL_{m-1}$ and the inverted data lines $\overline{DL}_0$ to $\overline{DL}_{m-1}$ can be charged at the precharge potential when returning the associative memory device of the present invention from the data read mode, the data write mode or the data retrieval mode to the standby mode, by simply shorting each other of the every pairs of the data lines $DL_0$ to $DL_{m-1}$ and the inverted data lines $\overline{DL}_0$ to $\overline{DL}_{m-1}$ if the precharge potential is equal to the substantially middle potential between the supply potential and the ground potential.

However, the potential at which the data lines $DL_0$ to $DL_{m-1}$ and the inverted data lines $\overline{DL}_0$ to $\overline{DL}_{m-1}$ are precharged by shorting each other of the every pairs of the data lines $DL_0$ to $DL_{m-1}$ and the inverted data lines $\overline{DL}_0$ to $\overline{DL}_{m-1}$ deviate from the predetermined precharge potential, i.e., the substantially middle potential between the supply potential and the ground potential, if the incremental voltage of the each one of the data lines $DL_0$ to $DL_{m-1}$ and the corresponding one of the inverted data lines $\overline{DL}_0$ to $\overline{DL}_{m-1}$ with respect to the predetermined precharge potential formed during one of the read, write and retrieval modes are different from each other.

Figure 8A:
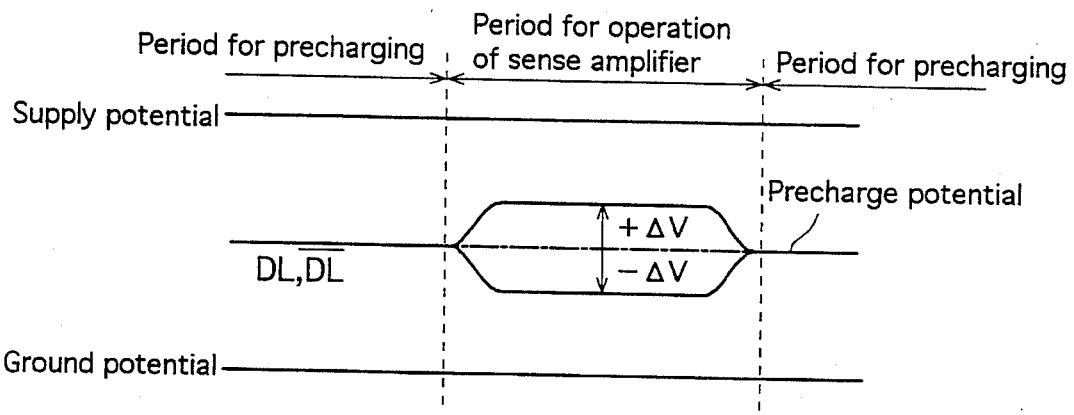
FIGS. 8(a) and 8(b) are timing diagrams for assistance in explaining a data read operation to be carried out by an associative memory device in accordance with the present invention.

FIG. 8(a) is a timing diagram for assistance in explaining one mode of the data read operation, by way of example, of the associate memory device of the present invention. Referring to FIG. 8(a), the data lines $DL_0$ to $DL_{m-1}$ and the inverted data lines $\overline{DL}_0$ to $\overline{DL}_{m-1}$ are precharged in the standby mode before the read mode at the substantially middle potential between the supply potential and the ground potential. When data are provided from the specified word memories on the data lines $DL_0$ to $DL_{m-1}$ and the inverted data lines $\overline{DL}_0$ to $\overline{DL}_{m-1}$ by the data read operation, the potential of the each one of the data lines $DL_0$ to $DL_{m-1}$ is raised by an incremental voltage $+\Delta V$ and that of the corresponding one of the inverted data lines $\overline{DL}_0$ to $\overline{DL}_{m-1}$ is lowered by an incremental voltage $-\Delta V$, or vice versa from the precharge potential. When the absolute values of the incremental voltages $+\Delta V$ and $-\Delta V$ are equal, the data lines $DL_0$ to $DL_{m-1}$ and the inverted data lines $\overline{DL}_0$ to $\overline{DL}_{m-1}$ will be precharged after the transition to the standby mode at a potential equal to the precharge potential in the standby mode before the read mode. No problem arises.

Figure 8B:
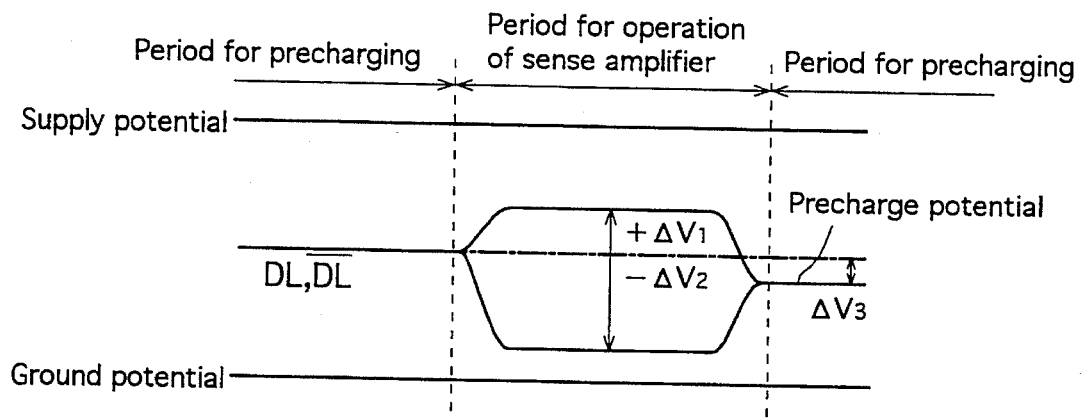

FIG. 8(b) is a timing diagram for assistance in explaining another mode of the data read operation, by way of example, of the associative memory device of the present invention. Referring to FIG. 8(b), the data lines $DL_0$ to $DL_{m-1}$ and the inverted data lines $\overline{DL}_0$ to $\overline{DL}_{m-1}$ are precharged, like those in the case shown in FIG. 8(a), at the precharge potential in the standby mode. When data are provided from the specified word memories on the data lines $DL_0$ to $DL_{m-1}$ and the inverted data lines $\overline{DL}_0$ to $\overline{DL}_{m-1}$ by the data read operation, the potential of the each one of the data lines $DL_0$ to $DL_{m-1}$ is rised by an incremental voltage $+\Delta V_1$ and that of the corresponding one of the data lines $\overline{DL}_0$ to $\overline{DL}_{m-1}$ is lowered by an incremental voltage $-\Delta V_2$, or vice versa from the precharge potential. When the absolute values of the incremental voltages $+\Delta V_1$ and $-\Delta V_2$ are different from each other, the data lines $DL_0$ to $DL_{m-1}$ and the inverted data lines $\overline{DL}_0$ to $\overline{DL}_{m-1}$ will be precharged by shorting the each other of the every pairs of data lines $DL_0$ to $DL_{m-1}$ and the inverted data lines $\overline{DL}_0$ to $\overline{DL}_{m-1}$ at a potential different from the precharge potential in the standby mode before the read mode and deviating by a potential $\Delta V_3$.

Preferably, such a deviation of the precharge potential from the predeterming precharge potential must be corrected before starting the next cycle of the operation or the occurrence of such a deviation must be prevented.

Figure 9:
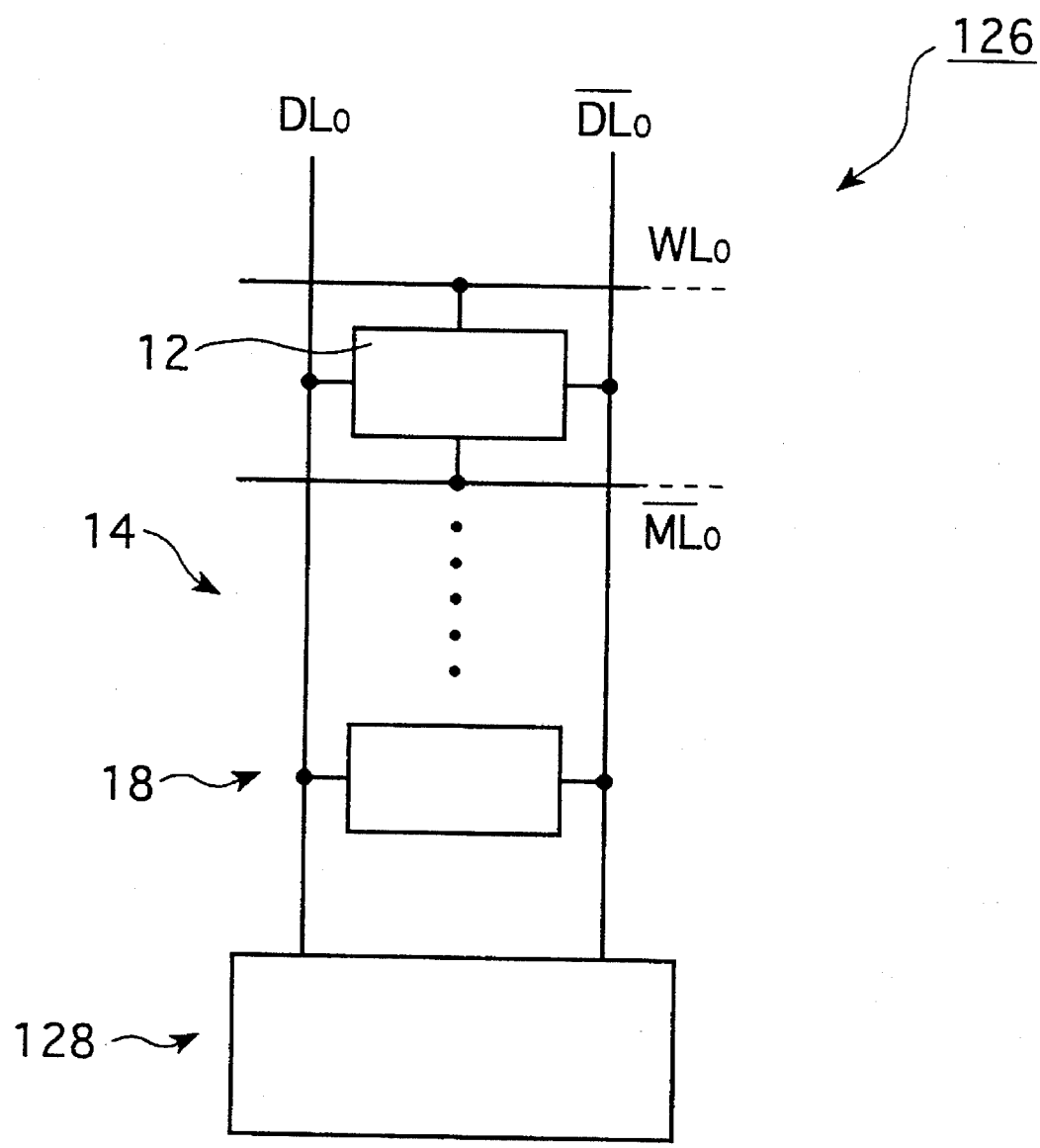
FIG. 9 is a block diagram of an associative memory device in the other embodiment according to the present invention.

FIG. 9 is a block diagram of an associative memory device 126 in a third embodiment according to the present invention capable of preventing the deviation of the precharge potential from an intended precharge potential. The associative memory device 126 shown in FIG. 9 differs from the associative memory devises 10 and 122 shown in FIGS. 1 and 6 only in that the associative memory device 126 is provided, in addition to the components of the associative memory devises 10 and 122, a data level control circuits 128, and the detailed description thereof will be omitted.

Figure 10A:
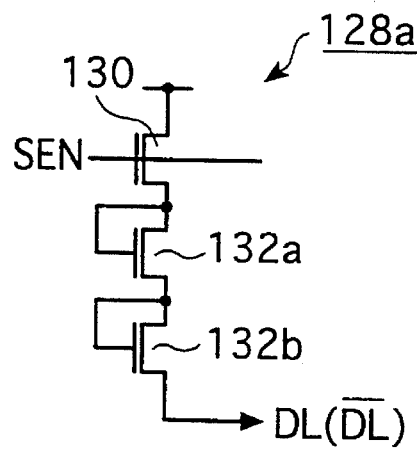
FIGS. 10(a), 10(b) and 10(c) are circuit diagrams of data line level control circuits applicable to the associative memory device in accordance with the present invention.
Figure 10B:
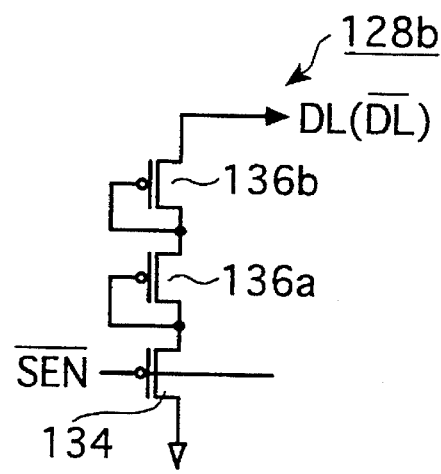
Figure 10C:
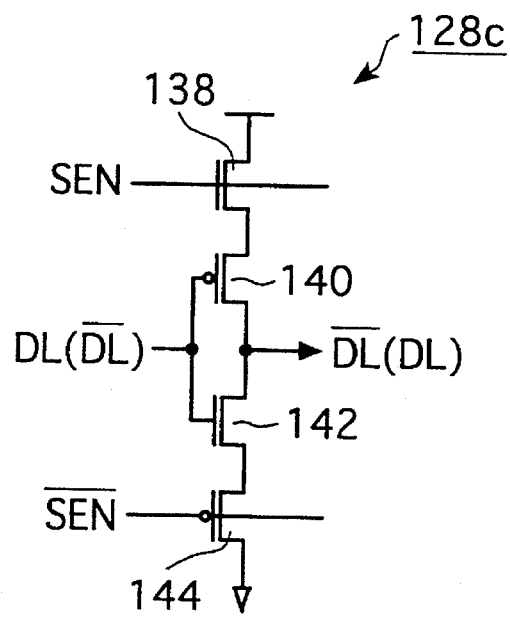

Referring to FIG. 9, the data level control circuit 128 of the associative memory device 126 corrects the potentials of the pair of the data line DL and the inverted data line $\overline{DL}$ to equalize the respective absolute values of the incremental voltage of the data line DL and that of the inverted data line $\overline{DL}$ during, for example, the data read operation. FIGS. 10(a), 10(b) and 10(c) are possible circuit configurations of the data level control circuit 128.

A data line level control circuit 128a shown in FIG. 10(a) comprises NMOSs 130, 132a and 132b. The drain of the NMOS 130 is connected to the power supply, and the gate of the NMOS 130 is connected to the sense amplifier enable line SEN. The drain and the gate of the NMOS 132a are shorted and connected to the source of the NMOS 130. Similarly, the drain and the gate of the NMOS 132b are shorted and connected to the source of the NMOS 132a, and the source of the NMOS 132b is connected to the data line DL. The same data line level control circuit as the data line level control circuit 128a is provided for the inverted data line $\overline{DL}$ and the source of the NMOS 132b of the data line level control circuit 123a is connected to the inverted data line $\overline{DL}$.

When the data read operation is carried out, i.e., when the sense amplifier 18 starts its operation, the sense amplifier enable line SEN goes HIGH, i.e., the sense amplifier enable line SEN is charged at the supply potential. If the potential of the data line DL is lower than the supply potential by a potential corresponding to the sum of the threshold voltages of the NMOSs 130, 132a and 132b, all the NMOSs 130, 132a and 132b are turned ON to connect the data line DL to the power supply. Consequently, the potential of the data line DL is clamped at a potential lower than the supply potential by a potential corresponding to the sum of the threshold voltages of the NMOSs 130, 132a and 132b, provided that the on-state resistance of the NMOS 130 is negligible.

A data line level controller 128b shown in FIG. 10(b) comprises PMOSs 134, 136a and 136b. The drain of the PMOS 134 is grounded, and the gate of the PMOS 134 is connected to the sense amplifier enable line $\overline{SEN}$. The drain and the gate of the PMOS 136a are shorted and connected to the source of the PMOS 134. Similarly, the drain and the gate of the PMOS 136b are shorted and connected to the source of the PMOS 136a, and the source of the PMOS 136b is connected to the data line DL. The same data line level control circuit as the data line level control circuit 128b is provided for the inverted data line $\overline{DL}$ and the source of the PMOS 136b of the data line level control circuit is connected to the inverted data line $\overline{DL}$.

When the data read operation is carried out in this data line level control circuit 128b, the sense amplifier enable line $\overline{\text{SEN}}$ goes LOW, i.e., the sense amplifier enable line $\overline{\text{SEN}}$ is charged at the ground potential. If the potential of the data line DL is higher than low level of the sense amplifier enable line $\overline{\text{SEN}}$ by a potential corresponding to the sum of the threshold voltages of the PMOSs 134, 136a and 136b, all the PMOSs 134, 136a and 136b are turned ON to connect the data line DL to the ground. Consequently, the data line DL and the inverted data line $\overline{\text{DL}}$ are clamped at a potential higher than the ground potential by a potential corresponding to the sum of the threshold potentials of the PMOSs 134, 136a and 136b, provided that the on-state resistance of the PMOS 134 is negligible.

When the associative memory device is provided with both the data line level control circuits 128a and 128b showing in FIGS. 10(a) and (b) in connection with the data line and the inverted data line, formation of the deviation of the absolute values of the incremental voltage of the data line DL and the inverted data line $\overline{\text{DL}}$ during the data read operation can be prevented by adjusting the threshold voltages of NMOSs 130, 132a, 132b and PMOSs 134, 136a, 136b, and setting the lowest and highest potentials for the data line DL and the inverted data line $\overline{\text{DL}}$.

A data line level control circuit 128c shown in FIG. 10(c) comprises NMOSs 138 and 142, and PMOSs 140 and 144. The drains of the NMOS 138 and the PMOS 144 are connected to the power supply and the ground, respectively, and the gates of the NMOS 138 and the PMOS 144 are connected to the sense amplifier enable lines SEN and $\overline{\text{SEN}}$, respectively. The sources of the PMOS 140 and the NMOS 142 are connected to the sources of the NMOS 138 and the PMOS 144, respectively, the gates of the PMOS 140 and the NMOS 142 are shorted and connected to the data line DL, and the drains of the PMOS 140 and the NMOS 142 are shorted and connected to the inverted data line $\overline{\text{DL}}$. The same data line level control circuit as the data line level control circuit 128c is provided for the inverted data line $\overline{\text{DL}}$, in which the gates of the PMOS 140 and the NMOS 142 are connected to the inverted data line $\overline{\text{DL}}$ and the drains of the PMOS 140 and the NMOS 142 are connected to the data line DL. The respective functions of these data line level control circuits 128c are complementary to each other.

When the data read operation is carried out, the sense amplifier enable lines SEN and $\overline{\text{SEN}}$ go HIGH and LOW, respectively. Since the data level control circuit 128c functions as an inverter, a latch circuit is formed between the data line DL and the inverted data line $\overline{\text{DL}}$, whereby the potentials of the data line DL and the inverted data line $\overline{\text{DL}}$ are corrected complementarily. The associative memory device 126 provided with the data line level control circuits 128 prevents the formation of the deviation of the absolute values of the incremental voltages on the data line and the inverted data line during the data read operation. Thus, the data lines $DL_0$ to $DL_{m-1}$ and the inverted data lines $\overline{DL}_0$ to $\overline{DL}_{m-1}$ can be precharged at the substantially middle potential between the supply potential and the ground potential in the standby mode, simply by shorting each other of the pair of the data lines $DL_0$ to $DL_{m-1}$ and the inverted data lines $\overline{DL}_0$ to $\overline{DL}_{m-1}$.

As described above, the associative memory device of the present invention comprises precharge circuits to precharge the data lines and the inverted data lines at the precharge potential, and the data line drivers to drive the data lines and the inverted data lines according to specified data. Therefore, in the standby mode, preferably, at least in the standby mode before the retrieval mode, the data lines and the inverted data lines can be precharged at an intermediate potential between the supply potential and the ground potential, preferably, at the substantially middle potential between the supply potential and the ground potential.

Since the data lines and the inverted data lines can be precharged at the intermediate potential between the supply potential and the ground potential in the standby mode, the associative memory device is able to operate at a high operating speed and only requires a current half the current required by the equivalent conventional associative memory device.

The associative memory device of the present invention and the conventional associative memory device were compared, and the effect of application of the data line structure of the associative memory device of the present invention to a SRAM and a DRAM was examined to evaluate the effects of the present invention.

It was assumed that the memory capacity of SRAMs and DRAMs, and that of associative memory devises (hereinafter referred to as "CAMs") is 256 Kb (128 word×2048 bit) and the memory devices are divided into blocks each having 4 Kb memory array (128 word×32 bit). Although practical SRAMs, DRAMs and CAMs differ from each other in memory capacity and block size, it was assumed the SRAM, the DRAM and the CAM are the same in the number of memory cells connected to one word line for the sake of comparison.

It was also assumed that the data line structures of the SRAM, the DRAM and the CAM (for example, the capacitances of the data lines to the substrate and those of the transfer gates (transfer gates 156a and 156b in FIG. 11)) are the same in both a case where the data line structure of the present invention was applied and a case where the same was not applied.

Accordingly, when the SRAM and the DRAM have a data line capacitance $C_{DL}$, the CAM has a data line capacitance $C_{DL}+C_G$, where $C_G$ is the gate capacitance of the transistor to which the data line is connected in the retrieval unit.

It was assumed that the supply voltage $V_{DD}$ is 5 V, the cycle time $\Delta t$ is 50 ns, the threshold voltage $V_{th}$ of the pull-up transistor used in the SRAM is 0.8 V, the data line capacitance $C_{DL}$ is 2 pF, and the gate capacitance $C_C$ is 0.7 pF.

1. DRAM

The data read operation and the data write operation are the same for the data lines.

For example, when refreshing all the cells by 256 refreshing cycles, 1024 cells are refreshed by one refreshing cycle in a 256 Kb DRAM. Generally, all the pairs of the data lines and the inverted data lines for 1024 bits are driven in both the read mode and the write mode regardless of the number of bits of the data to be read or to be written (thirty-two bits in this example) for the purpose of rewriting. Therefore, cells for thirty-two words (32 bits×32 words×1024 bits) operate in one read or write cycle. Current i necessary for such a mode of operation is:

a) $i=(C_{DL} \times V_{DD}) \times 1024/\Delta t = 204.8$ mA when the precharge potential is equal to the supply voltage $V_{DD}$, and b) $i=102.4$ mA when the precharge potential is half the supply voltage $V_{DD}$, i.e., $V_{DD}/2$.

2. SRAM

Suppose that a current mirror type sense amplifiers are employed. Then, the pair of the data lines and the inverted data lines corresponding to thirty-two bits operate. Generally, both the data lines DL and the inverted data lines $\overline{\text{DL}}$ are precharged at $(V_{DD}-V_{th})$ to increase the sensitivity of the sense amplifiers. The current necessary for the data read operation is not dependent on the currents for charging and the current for discharging the data lines and the inverted data lines, but dependent on DC currents that flows through the pull-up transistors to the cells; that is, the current necessary for the data read operation is not dependent on the precharge potential. In the data write operation, to change the binary data HIGH and LOW of the SRAM cells, full swing of the potential of one of the pair of the data line and the inverted data line is necessary and hence the following current i is necessary.

$$i=C_{DL}\times(V_{DD}-V_{th})\times 32/\Delta t=5.4 \text{ mA}$$

The current necessary for the data writing operation can be reduced by reducing the precharge potential to half the supply voltage. However, its power consumption reducing effect with the SRAM is not as great as the effect with the DRAM. Generally, a precharge potential of $(V_{DD}-V_{th})$ is employed to increase the sensitivity of the sense amplifiers.

Similarly, the precharge potential of half the supply voltage is not generally employed in the ROM.

3. retrieving operation of CAM

All the data lines for 2048 bits operate.

a) Since the precharge potential is $V_{DD}$ and full swing is necessary in the convention CAM, the current consumption of the conventional CAM is showing as below:

$$i=(C_{DL}+C_G)\times V_{22}\times 2048/\Delta t=553 \text{ mA}$$

b) Since the precharge potential is $V_{DD}/2$ in the CAM of the present invention, the current consumption of the present invention CAM is half of the current consumption of the conventional CAM.

$$i=276 \text{ mA}$$

As is apparent from the foregoing description of the examples, the reducing effect of the current consumption i of the present invention CAM for retrieving data is 276 mA, which is very large compared with the reducing effect of 102.4 mA for reading data from and writing data to the DRAM. The power consumption reducing effect of employing the precharge potential equal to half the supply voltage in the data retrieval operation is effective when DRAM cells or ROM cells are employed as the memory cells as well as when SRAM cells are employed as the memory cells.

Thus, the associated memory device of the present invention is highly effective in reducing current requirement and power consumption.

The purpose of precharging at a precharge potential equal to half the supply voltage which has been applied to the DRAM is to reduce the necessary current due to the rewriting operation peculiar to the DRAM. Accordingly, the great reduction of the current necessary for the data retrieval operation by the associative memory device of the present invention could not have been expected on the basis of the conventional knowledge.

Particularly, the great effect on the current (power) consumption reduction on the associative memory device employing SRAM cells or ROM cells as memory cells could not have been expected at all because the precharging at half the supply voltage has not been employed in the SRAM or ROM.

What is claimed is:

1. An associative memory device comprising:

a memory array comprising a plurality of associative memory cells arranged in rows and columns, and pairs of a data line and an inverted data line, each pair for each column of the memory array;

precharge circuits each provided for each pair of the data line and the inverted data line to precharge the data lines and the inverted data lines to a precharge potential in a standby mode before at least a data retrieval mode; and data line drivers each provided for the each pair of the data line and the inverted data line to drive the data lines and the inverted data lines to one of a HIGH logic level and a LOW logic level at least in the data retrieval mode;

wherein the precharge potential is lower than a supply potential and higher than a ground potential.

2. An associative memory device according to claim 1, further comprising a data line potential generator to generate and supply the precharge potential to the precharge circuits.

3. An associative memory device according to claim 1, wherein each of the data line driver and each of the precharge circuit are united in an integral unit.

4. An associative memory device according to claim 1, further comprising data line level control circuits each provided for the each pair of the data line and the inverted data line to prevent formation of a deviation of absolute values of incremental voltages from the precharge potential in the pair of the data line and the inverted data line.

5. An associative memory device according to claim 4, wherein the precharge circuits precharge the data lines and the inverted data lines to the precharge potential also in a standby mode before a read mode; and the data line level control circuits prevents formation of the deviation of the absolute values of the incremental voltages in the pair of the data line and the inverted data line during the read mode.

6. An associative memory device according to claim 1, wherein the precharge potential is substantially equal to a middle potential between a supply potential and a ground potential.

7. An associative memory device according to claim 1, wherein the associative memory cells include one of a SRAM cell and a ROM cell.

8. An associative memory device according to claim 1, wherein both of the each pair of the data line and the inverted data line are connected to all of the cells in the corresponding column of the memory array.

9. An associative memory device comprising:

a memory array comprising a plurality of associative memory cells arranged in rows and columns, and pairs of a data line and an inverted data line, each pair for each column of the memory array;

precharging means for precharging the data lines and the inverted data lines to a precharge potential in a standby mode before at least a data retrieval mode; and driving means for driving the data lines and the inverted data lines to one of a HIGH logic level and a LOW logic level at least in the data retrieval mode;

wherein the precharge potential is lower than a supply potential and higher than a ground potential.

10. An associative memory device according to claim 9, further comprising precharge potential generating means for generating and supplying the precharge potential to the precharging means.

11. An associative memory device according to claim 9, wherein the driving means and the precharging means are united in an integral unit.

12. An associative memory device according to claim 9, wherein the precharge potential is substantially equal to a middle potential between a supply potential and a ground potential.

13. An associative memory device according to claim 9, wherein the associative memory cells include one of a SRAM cell and a ROM cell.

14. An associative memory device comprising:
- a memory array comprising a plurality of associative memory cells arranged in rows and columns, and pairs of a data line and an inverted data line, each pair for each column of the memory array;
- precharge circuits each provided for each pair of the data line and the inverted data line to precharge the data lines and the inverted data lines to a precharge potential in a standby mode before at least a data retrieval mode; and
- data line drivers each provided for the each pair of the data line and the inverted data line to drive the data lines and the inverted data lines to one of a HIGH logic level and a LOW logic level at least in the data retrieval mode;
- wherein the precharge potential is substantially equal to a middle potential between the HIGH logic level and the LOW logic level.

* * * * *